(12) United States Patent
Tsai et al.

(10) Patent No.: US 10,062,582 B2
(45) Date of Patent: Aug. 28, 2018

(54) FABRICATION METHOD OF PACKAGE HAVING ESD AND EMI PREVENTING FUNCTIONS

(71) Applicant: Siliconware Precision Industries Co., Ltd., Taichung (TW)

(72) Inventors: Tsung-Hsien Tsai, Taichung (TW); Chih-Hsien Chiu, Taichung (TW); Hsin-Lung Chung, Taichung (TW); Chien-Cheng Lin, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 24 days.

(21) Appl. No.: 14/817,624

(22) Filed: Aug. 4, 2015

(65) Prior Publication Data

US 2015/0340248 A1    Nov. 26, 2015

Related U.S. Application Data

(62) Division of application No. 12/987,613, filed on Jan. 10, 2011, now Pat. No. 9,111,945.

(30) Foreign Application Priority Data

Nov. 26, 2010  (TW) .............................. 99140955 A

(51) Int. Cl.
*H01L 21/60* (2006.01)
*H01L 21/48* (2006.01)
(Continued)

(52) U.S. Cl.
CPC ........ *H01L 21/4853* (2013.01); *H01L 21/561* (2013.01); *H01L 21/563* (2013.01); *H01L 21/78* (2013.01); *H01L 23/552* (2013.01); *H01L 24/19* (2013.01); *H01L 24/20* (2013.01); *H01L 24/97* (2013.01); *H01L 2224/0401* (2013.01); *H01L 2224/04105* (2013.01); *H01L 2224/16225* (2013.01); *H01L 2224/32225* (2013.01); *H01L 2224/48091* (2013.01); *H01L 2224/48227* (2013.01); *H01L 2224/73267* (2013.01);
(Continued)

(58) Field of Classification Search
CPC ...................................... H01L 21/561
USPC .................................. 438/112, 113
See application file for complete search history.

(56) References Cited

U.S. PATENT DOCUMENTS 5,166,772 A    11/1992  Soldner et al.
6,187,613 B1    2/2001  Wu et al.
(Continued)

*Primary Examiner* — Igwe U Anya
(74) *Attorney, Agent, or Firm* — Mintz Levin Cohn Ferris Glovsky and Popeo, P.C.; Peter F. Corless; Steven M. Jensen

(57) ABSTRACT

A package having ESD (electrostatic discharge) and EMI (electromagnetic interference) preventing functions includes: a substrate unit having a ground structure and an I/O structure disposed therein; at least a semiconductor component disposed on a surface of the substrate unit and electrically connected to the ground structure and the I/O structure; an encapsulant covering the surface of the substrate unit and the semiconductor component; and a metal layer disposed on exposed surfaces of the encapsulant and side surfaces of the substrate unit and electrically insulated from the ground structure, thereby protecting the semiconductor component against ESD and EMI so as to improve the product yield and reduce the risk of short circuits.

14 Claims, 8 Drawing Sheets

(51) Int. Cl.
  *H01L 21/56* (2006.01)
  *H01L 21/78* (2006.01)
  *H01L 23/552* (2006.01)
  *H01L 23/00* (2006.01)

(52) U.S. Cl.
  CPC ............ *H01L 2224/92244* (2013.01); *H01L 2224/97* (2013.01); *H01L 2924/01029* (2013.01); *H01L 2924/15311* (2013.01); *H01L 2924/181* (2013.01); *H01L 2924/3025* (2013.01)

(56) References Cited

U.S. PATENT DOCUMENTS

| | | |
|---|---|---|
| 6,472,598 B1 | 10/2002 | Glenn |
| 7,145,084 B1 | 12/2006 | Sarihan et al. |
| 8,264,070 B2 | 9/2012 | Tsai et al. |
| 2004/0231872 A1 | 11/2004 | Arnold et al. |
| 2005/0013082 A1 | 1/2005 | Kawamoto et al. |
| 2006/0091509 A1 | 5/2006 | Zhao et al. |
| 2006/0274517 A1 | 12/2006 | Coffy |
| 2007/0018287 A1* | 1/2007 | Coenen .................. H01L 23/50 257/666 |
| 2008/0061407 A1 | 3/2008 | Yang et al. |
| 2008/0174013 A1* | 7/2008 | Yang .................... H01L 23/3121 257/737 |
| 2009/0236686 A1* | 9/2009 | Shim ..................... H01L 21/568 257/528 |
| 2009/0256244 A1* | 10/2009 | Liao ..................... H01L 21/568 257/660 |
| 2009/0294928 A1 | 12/2009 | Kim et al. |
| 2009/0302436 A1 | 12/2009 | Kim et al. |
| 2009/0302437 A1 | 12/2009 | Kim et al. |
| 2009/0315156 A1* | 12/2009 | Harper .................. H01L 23/552 257/660 |
| 2010/0019359 A1* | 1/2010 | Pagaila .................. H01L 21/568 257/659 |
| 2010/0020518 A1* | 1/2010 | Bustamante ........ H01L 23/3121 361/818 |
| 2010/0172116 A1* | 7/2010 | Yorita ................... H01L 21/565 361/816 |
| 2010/0207258 A1 | 8/2010 | Eun et al. |
| 2010/0207259 A1 | 8/2010 | Liao et al. |
| 2010/0277963 A1 | 11/2010 | Nishizawa et al. |
| 2011/0006408 A1 | 1/2011 | Liao |
| 2011/0018119 A1* | 1/2011 | Kim .................... H01L 23/3128 257/690 |
| 2011/0278703 A1* | 11/2011 | Pagaila ............... H01L 23/5389 257/659 |
| 2012/0074538 A1 | 3/2012 | Tsai et al. |
| 2012/0119346 A1 | 5/2012 | Im et al. |

\* cited by examiner

FABRICATION METHOD OF PACKAGE HAVING ESD AND EMI PREVENTING FUNCTIONS

CROSS-REFERENCE TO RELATED APPLICATIONS

This application is a divisional of application U.S. Ser. No. 12/987,613, filed on Jan. 10, 2011, being issued as U.S. Pat. No. 9,111,945 with an issue date of Aug. 18, 2015, which claims under 35 U.S.C. § 119(a) the benefit of Taiwanese Application No. 099140955, filed Nov. 26, 2010, the entire contents of which are incorporated herein by reference.

BACKGROUND OF THE INVENTION

1. Field of the Invention

The present invention relates to semiconductor packages and fabrication methods thereof, and more particularly, to a package having ESD (electrostatic discharge) and EMI (electromagnetic interference) preventing functions and a fabrication method thereof.

2. Description of Related Art

Along with the rapid development of science and technology, electronic products are becoming lighter, thinner, shorter and smaller so as to make it easy for consumers to carry and use the products. A method for forming a semiconductor package generally comprises: mounting and electrically connecting a semiconductor chip to a carrier; encapsulating the semiconductor chip and the carrier with an encapsulant such as an epoxy resin so as to protect the semiconductor chip and the carrier against external moisture or pollutants; and covering the encapsulant with a lid member such as a metal shell or, alternatively, covering the semiconductor chip and the carrier with a lid member such as a metal shell, thereby protecting the semiconductor chip from being damaged by external influences, such as ESD, and blocking internal and external EMI and EMC (electromagnetic compatibility).

In such a package, the lid member is electrically connected to a ground structure of the package and further electrically connected to a system ground to thereby conduct away external electromagnetic radiation and electrostatic charges.

FIGS. 1A and 1B show a semiconductor package with a meshed metal shield as disclosed by U.S. Pat. No. 5,166,772. Referring to FIGS. 1A and 1B, a meshed metal shield 12 is disposed on a substrate 10 to cover a chip 11, and an encapsulant 13 encapsulates the metal shield 12 and the chip 11. The metal shield 12 is electrically connected to a ground circuit 14 of the substrate 10 so as to shield EMI generated by the chip 11 or an external device.

FIG. 2 shows another semiconductor package as disclosed by U.S. Pat. No. 6,187,613. Referring to FIG. 2, a chip 11 is mounted to a substrate 10 through a plurality of conductive bumps 15 in a flip-chip manner, a metal foil 16 is attached to the substrate 10 and the chip 11, and an encapsulant 13 is filled between the metal foil 16 and the substrate 10. Therein, the metal foil 16 shields EMI generated by the chip 11 or an external device.

However, since the meshed metal shield or the metal foil is electrically connected to the ground circuit of the chip and active/passive components, when the semiconductor package is disposed on a circuit board, if the meshed metal shield or the metal foil carries electrostatic charges, the electrostatic charges can be conducted through the ground circuit to the circuit board, the chip and the active/passive components. When the electrostatic charges are conducted to the chip and the active/passive components, an electrostatic discharge can occur, thereby easily causing damage of the chip and the active/passive components.

Further, due to too long electrical connecting path from the metal shield or the metal foil to the system ground, especially for a substrate 10 with more than six wiring layers, the grounding effect is adversely affected such that electrostatic charges cannot be released rapidly, thereby easily causing damage of the chip or other active/passive components.

Therefore, it is imperative to provide a package capable of protecting internal chips or active/passive components from being damaged by static electricity and having a preferred EMI preventing function.

SUMMARY OF THE INVENTION

Accordingly, the present invention provides a package having ESD (electrostatic discharge) and EMI (electromagnetic interference) preventing functions, which comprises: a substrate unit having a ground structure and an I/O structure disposed therein; at least a semiconductor component disposed on a surface of the substrate unit and electrically connected to the ground structure and the I/O structure of the substrate unit; an encapsulant covering said surface of the substrate unit and the semiconductor component; and a metal layer disposed on exposed surfaces of the encapsulant and side surfaces of the substrate unit and electrically insulated from the ground structure of the substrate unit.

The present invention further provides a fabrication method of a package having ESD and EMI preventing functions, which comprises the steps of: preparing a pre-formed package, wherein the pre-formed package comprises: a package substrate having a plurality of substrate units each having a ground structure and an I/O structure disposed therein, a plurality of semiconductor components disposed on surfaces of the substrate units and electrically connected to the ground structures and the I/O structures of the substrate units, and an encapsulant covering said surfaces of the substrate units and the semiconductor components; cutting the encapsulant and the package substrate of the pre-formed package along edges of each of the substrate units so as to obtain a plurality of separate package units; and forming a metal layer on exposed surfaces of the encapsulant and side surfaces of the substrate unit of each of the package units, the metal layer being electrically insulated from the ground structure of the substrate unit.

In an embodiment, the fabrication method of the pre-formed package comprises the steps of: providing a package substrate having a plurality of substrate units each having a first surface with a plurality of first conductive pads and ESD protection pads and a second surface opposite to the first surface, wherein the first conductive pads are electrically connected to the ground structure and the I/O structure, respectively; disposing at least a semiconductor component on the second surface of each of the substrate units and electrically connecting the semiconductor component to the ground structure and the I/O structure of the substrate unit; and covering the second surfaces of the substrate units and the semiconductor components with an encapsulant.

In another embodiment, the package substrate is a build-up layer, and the fabrication method of the pre-formed package comprises the steps of: providing at least a semiconductor component that is embedded in an encapuslant, wherein the semiconductor component has an active surface and a non-active surface opposite to the active surface, and the active surface of the semiconductor component is exposed from the encapsulant; and forming a build-up layer on the active surface of the semiconductor component and the encapsulant so as to use the build-up layer as a package substrate.

In the above-described package and fabrication method thereof, the substrate unit has a first surface with a plurality of first conductive pads and ESD protection pads and a second surface opposite to the first surface, wherein the first conductive pads are electrically connected to the ground structure and the I/O structure, respectively, the semiconductor component is disposed on the second surface of the substrate unit, and the encapsulant covers the second surface of the substrate unit.

Preferably, the ESD protection pads are disposed around the periphery of the substrate unit. In an embodiment, the ESD protection pads are spaced from the metal layer.

In another embodiment, the ESD protection pads consist of first sub-pads and second sub-pads spaced from the first sub-pads, wherein the first sub-pads are disposed on edges of the first surface of the substrate unit and flush with the side surfaces of the substrate unit. Further, the first sub-pads are electrically insulated from the ground structure.

Alternatively, at least a portion of the ESD protection pads are disposed on edges of the first surface of the substrate unit and flush with the side surfaces of the substrate unit so as to come into contact with the metal layer. Also, the portion of the ESD protection pads can comprise indentations disposed at edges flush with the side surfaces of the substrate unit. Further, the portion of the ESD protection pads are electrically insulated from the ground structure of the substrate unit. In addition, side surfaces of the encapsulant can be flush with the side surfaces of the substrate unit, and a plurality of conductive elements can be disposed on the first surface of the substrate unit for connecting the metal layer and the ESD protection pads.

In the above-described package and fabrication method thereof, the second surface of the substrate unit has a plurality of second conductive pads and the semiconductor component is electrically connected to the second conductive pads through bonding wires or in a flip-chip manner.

Therefore, the present invention involves forming a metal layer on exposed surfaces of the encapsulant and side surfaces of the substrate unit of a package unit and then forming conductive elements connecting the metal layer and ESD protection pads. By ground connecting the metal layer through the conductive elements, the present invention can protect the semiconductor component of the package unit against EMI. In particular, before the package is disposed on a circuit substrate, if electrostatic charges present on the metal layer, they will not be conducted to the semiconductor component through the ground structure of the package, thus protecting the semiconductor component from being adversely affected by an electrostatic discharge; on the other hand, when the package is disposed on the circuit substrate, the metal layer is connected to a ground system of the circuit substrate through the conductive elements so as to provide EMI shielding for the semiconductor component and release static charges.

BRIEF DESCRIPTION OF DRAWINGS

FIGS. 3A to 3F are cross-sectional views showing a package having ESD and EMI preventing functions and a fabrication method thereof according to the present invention, wherein FIG. 3A is a bottom view of FIG. 3A', FIG. 3B' shows another embodiment of FIG. 3B, and FIG. 3E' is a bottom view of FIG. 3E;

FIGS. 4A to 4C show a second embodiment of ESD protection pads of the package according to the present invention, wherein FIG. 4A is a bottom view of a package substrate, FIG. 4B is a cross-sectional view of a package unit, and FIG. 4C is a cross-sectional view of the package unit disposed on a circuit substrate;

FIGS. 5A and 5B show a third embodiment of ESD protection pads of the package according to the present invention, wherein FIG. 5A is a bottom view of a package substrate, and FIG. 5B is a cross-sectional view of a package unit;

FIGS. 6A and 6B show a fourth embodiment of ESD protection pads of the package according to the present invention, wherein FIG. 6A is a bottom view of a package substrate, and FIG. 6B is a bottom view of a package unit.

DETAILED DESCRIPTION OF PREFERRED EMBODIMENTS

The following illustrative embodiments are provided to illustrate the disclosure of the present invention, these and other advantages and effects can be apparent to those in the art after reading this specification.

Figure 1A:
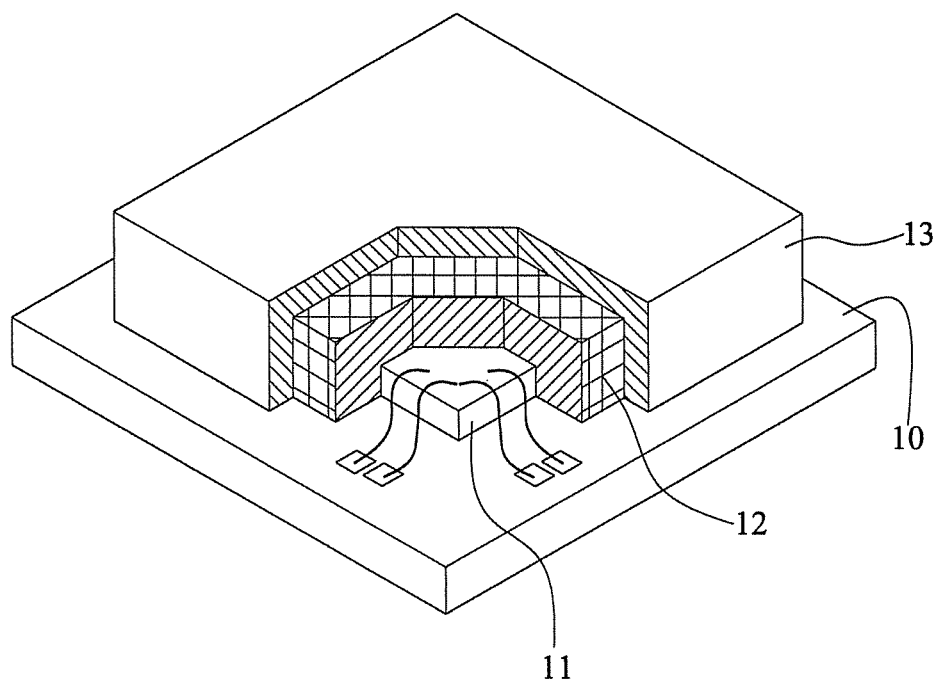
FIGS. 1A and 1B are a cutaway view and a cross-sectional view, respectively, of a semiconductor package disclosed by U.S. Pat. No. 5,166,772.
Figure 1B:
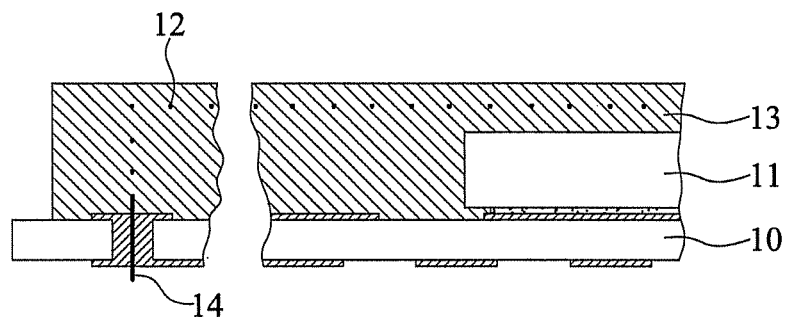
Figure 2:
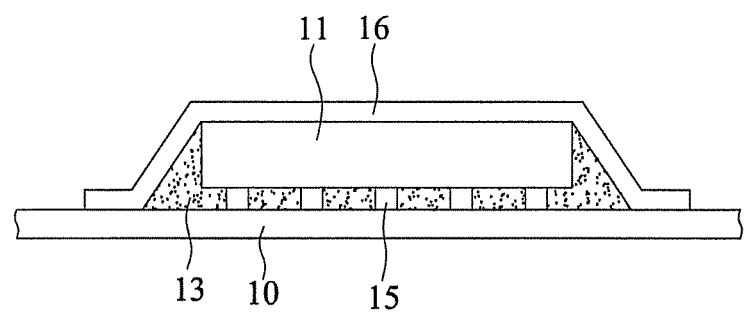
FIG. 2 is a cross-sectional view of a semiconductor package disclosed by U.S. Pat. No. 6,187,613.
Figure 3A:
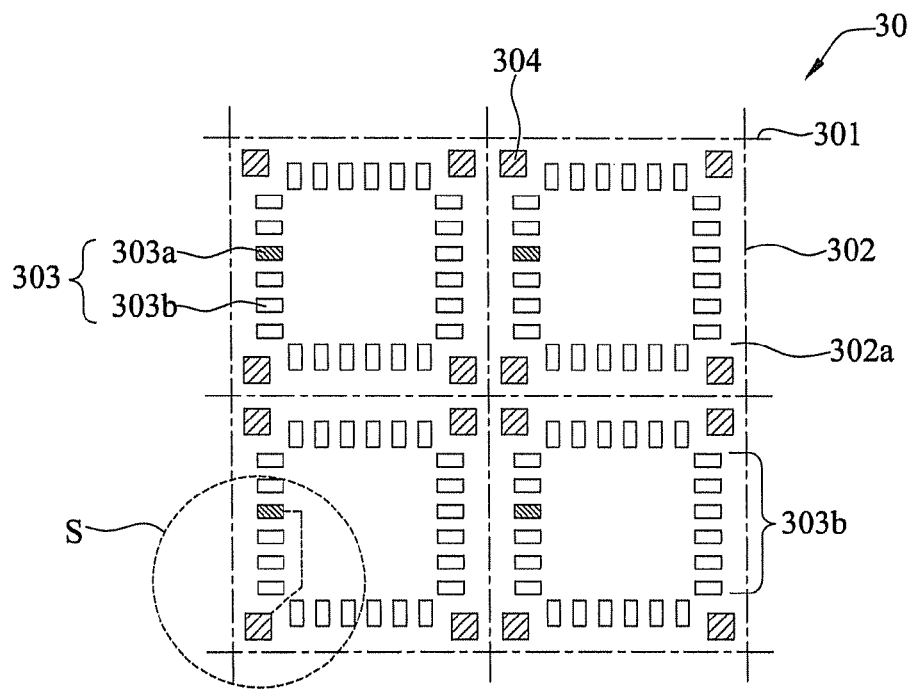
Figure 3A:
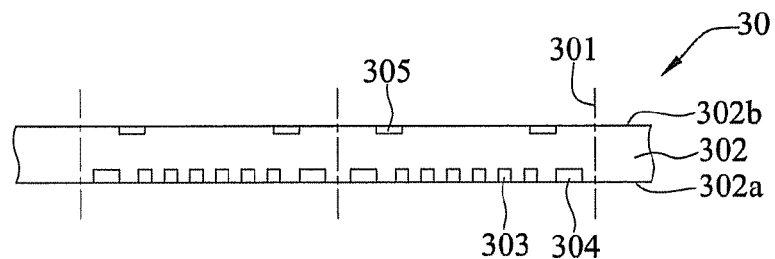
Figure 3B:
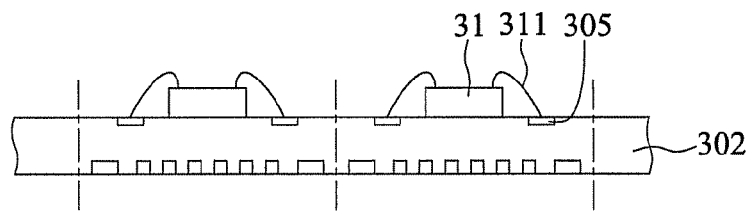
Figure 3B:
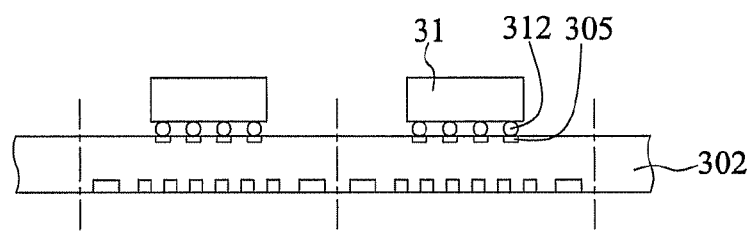
Figure 3C:
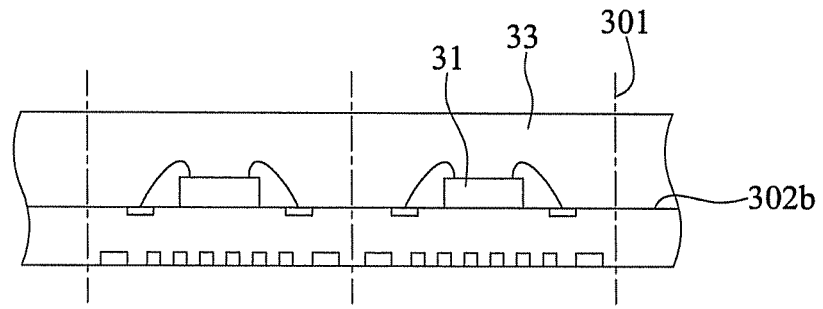

It should be noted that all dimensional and structural information included in the drawings is merely illustrative and not intended to limit the scope of the present invention. Various modifications and variations based on different viewpoints and applications can be made in the details of the specification without departing from the spirit of the present invention. Further, terms such as "above", "one", "at least one" etc. are merely for illustrative purpose and should not be construed to limit the scope of the present invention First Embodiment FIGS. 3A to 3F show a package having ESD and EMI preventing functions and a fabrication method thereof according to a first embodiment of the present invention. First, a pre-formed package is prepared, and the fabrication method thereof is shown in FIGS. 3A to 3C. Referring to FIGS. 3A and 3A', a package substrate 30 having a plurality of substrate units 302 defined by a plurality of cutting lines 301 is provided. Each of the substrate units 302 has a ground structure and an I/O structure (not shown) disposed therein and a first surface 302a and a second surface 302b opposite to the first surface 302a. The first surface 302a has a plurality of first conductive pads 303 and ESD protection pads 304. The first conductive pads 303 comprise ground pads 303a and I/O pads 303b. The first conductive pads 303 are electrically connected to the ground structure and the I/O structure, respectively, and the ground structure and the I/O structure extend to the second surface 302b of the substrate unit 302 for electrically connecting to a semiconductor component to be disposed later. Further, the second surface 302b has a plurality of second conductive pads 305, as shown in FIG. 3A'. The second conductive pads 305 are electrically connected to the ground structure and the I/O structure, respectively. Preferably, the ESD protection pads 304 are disposed around each of the substrate units 302. For example, the ESD protection pads 304 can be disposed close to the edges or corners of the substrate unit 302 so as to shorten electrical connection path, but do not extend to the edges of the substrate unit 302. For example, the ESD protection pads 304 are 0.1 mm to 10 mm away from the edges of the substrate unit 302. The ESD protection pads 304 can be dummy pads or electrically connected to the ground structure such as the ground pads 303a, as shown in region S of FIG. 3A.

Referring to FIGS. 3B and 3B', at least a semiconductor component 31 such as a chip is disposed on the second surface 302b of each of the substrate units 302 and electrically connected to the ground structure and the I/O structure of the substrate unit 302. For example, the semiconductor component 31 is electrically connected to the second conductive pads 305 through bonding wires 311, as shown in FIG. 3B; or the semiconductor component 31 is electrically connected to the second conductive pads 305 through solder bumps 312, as shown in FIG. 3B'.

Referring to FIG. 3C, an encapsulant 33 is formed to cover the second surfaces 302b of the substrate units 302 and the semiconductor components 31 so as to obtain a pre-formed package.

Figure 3D:
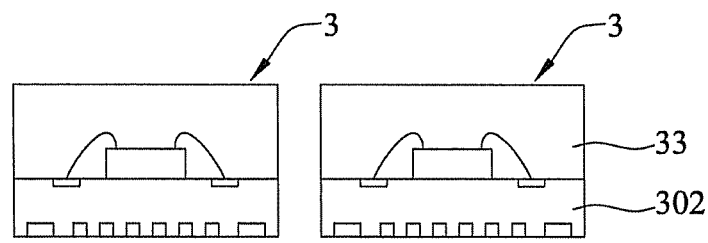

Referring to FIG. 3D, the encapsulant 33 and the package substrate 30 are cut along the edges of each of the substrate units 302 (i.e. along the cutting lines 301) so as to obtain a plurality of separate package units 3. In each of the package units 3, side surfaces of the encapsulant 33 are flush with side surfaces of the substrate unit 302.

Figure 3E:
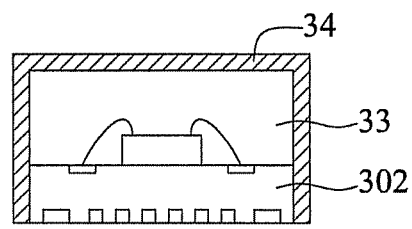
Figure 3E:
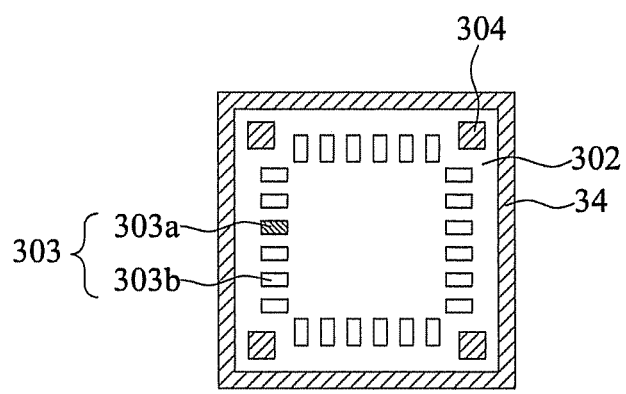

Referring to FIGS. 3E and 3E', for each of the package units 3, a metal layer 34 is formed on exposed surfaces of the encapsulant 33 and the side surfaces of the substrate unit 302 by sputtering and electrically insulated from the ground structure of the substrate unit 302. The metal layer 34 can be made of such as Cu, Ni, Fe, Al, Sus (stainless steel) etc. The ESD pads 304 are spaced from the metal layer 34 so as to electrically insulating the metal layer 34 from the ground structure of the substrate unit. Therefore, before the package unit is disposed on a circuit substrate, if electrostatic charges present on the metal layer, they will not be conducted through the ground structure of the substrate unit to the semiconductor component, for example, an active component such as a chip or a passive component, thereby protecting the semiconductor component from being adversely affected by an electrostatic discharge.

Figure 3F:
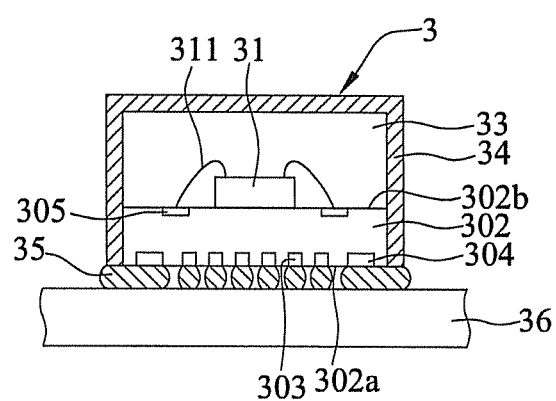

Referring to FIG. 3F, when the package unit 3 is disposed on a circuit substrate 36, a plurality of conductive elements 35 disposed on the circuit substrate 36 and made of such as a solder material electrically connect to the metal layer 34 and the ESD protection pads 304 so as to connect the metal layer 34 to a ground system of the circuit substrate 36, thereby conducting electrostatic charges through the conductive elements 35 to the ground system of the circuit substrate 36 and providing EMI shielding for the semiconductor component.

According to the above-described fabrication method, the present invention further provides a package having ESD and EMI preventing functions, which comprises: a substrate unit 302 having a ground structure and an I/O structure disposed therein; at least a semiconductor component 31 disposed on a surface of the substrate unit 302 and electrically connected to the ground structure and the I/O structure; an encapsulant 33 covering said surface of the substrate unit 302 and the semiconductor component 31; and a metal layer 34 disposed on exposed surfaces of the encapsulant 33 and side surfaces of the substrate unit 302 and electrically insulated from the ground structure of the substrate unit 302.

In particular, the substrate unit 302 has a first surface 302a with a plurality of first conductive pads 303 and ESD protection pads 304 and a second surface 302b opposite to the first surface 302a, wherein the first conductive pads 303 comprise ground pads 303a and I/O pads 303b, and the first conductive pads 303 are electrically connected to the ground structure and the I/O structure, respectively; the semiconductor component 31 is disposed on the second surface 302b of the substrate unit 302 and electrically connected to the ground structure and the I/O structure; and the encapsulant 33 covers the second surface 302b of the substrate unit 302 and the semiconductor component 31.

As described above, the ESD protection pads 304 are preferably disposed around the periphery of the substrate unit 302. For example, the ESD protection pads 304 are disposed close to the edges or corners of the substrate unit 302 and spaced from the metal layer to shorten electrical connection path. For example, the ESD protection pads 304 are 0.1 mm to 1.0 mm away from the edges of the substrate unit 302. At least one of the ESD pads 304 is a dummy pad or electrically connected to the ground structure of the substrate unit 302 such as a ground pad 303a, as shown in region S of FIG. 3A.

The second surface 302b of the substrate unit 302 has a plurality of second conductive pads 305. The semiconductor component 31 is electrically connected to the second conductive pads 305 through bonding wires 311 or solder bumps 312.

Second Embodiment

Figure 4A:
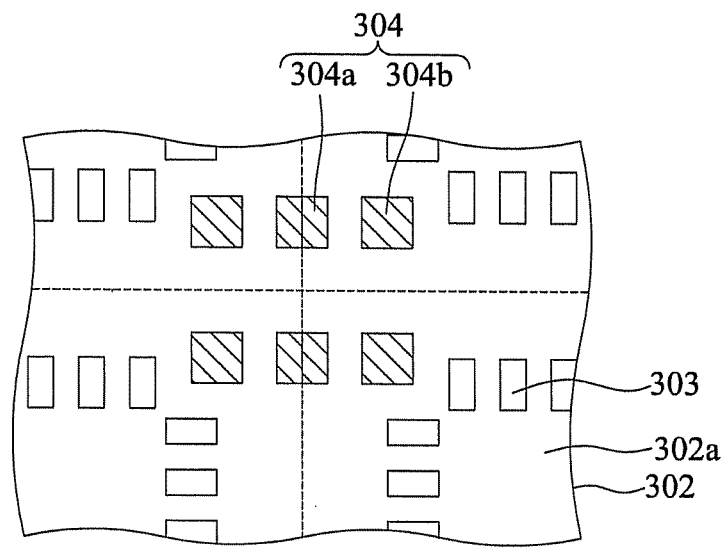
Figure 4B:
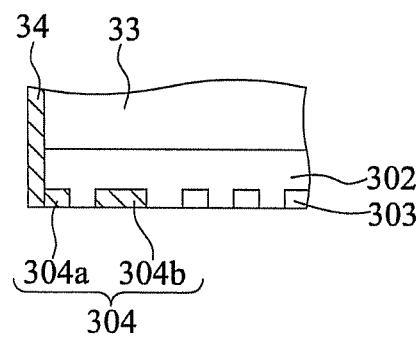
Figure 4C:
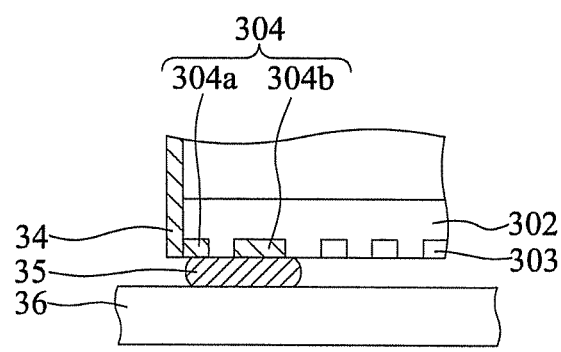

When the conductive elements 35 made of a solder material cannot wet the metal layer 34 made of such as Al or Sus, another embodiment of the ESD protection pads 304 is provided, as shown in FIGS. 4A to 4C. Referring to FIG. 4A, the ESD protection pads 304 consist of first sub-pads 304a and second sub-pads 304b spaced from the first sub-pads 304a, wherein the first sub-pads 304a are disposed on edges of the first surface 302a and flush with the side surfaces of the substrate unit 302.

Referring to FIGS. 4B and 4C, after the encapsulant 33 and the package substrate 30 are cut and the metal layer 34 is formed, the first sub-pads 304a come into contact with the metal layer 34. Further, the first sub-pads 304a are electrically insulated from the ground structure of the substrate unit. For example, the first sub-pads 304a are dummy pads. The second sub-pads 304b can be dummy pads or electrically connected to the ground structure of the substrate unit. Then, when the package unit 3 is disposed on the circuit substrate 36, the conductive elements 35 electrically connect to the first sub-pads 304a and the second sub-pads 304b so as to connect the metal layer 34 to the ground system of the circuit substrate 36, thereby conducting electrostatic charges through the conductive elements 35 to the ground system of the circuit substrate 36 and providing EMI shielding for the semiconductor component.

Third Embodiment

Figure 5A:
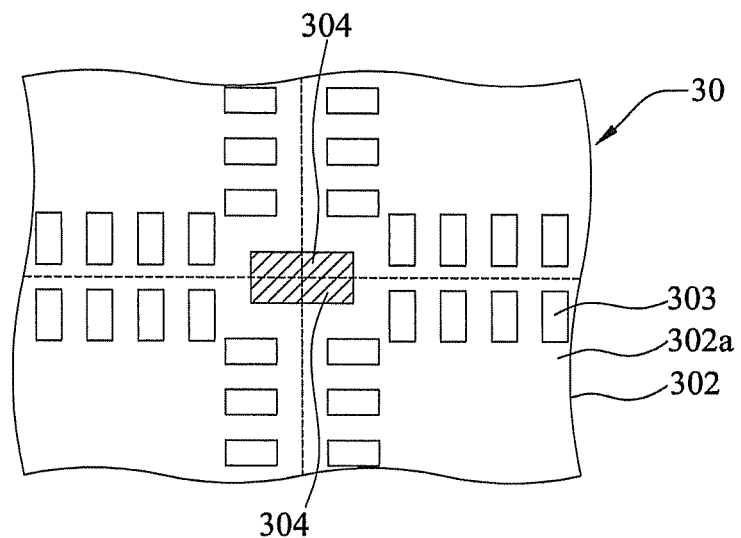
Figure 5B:
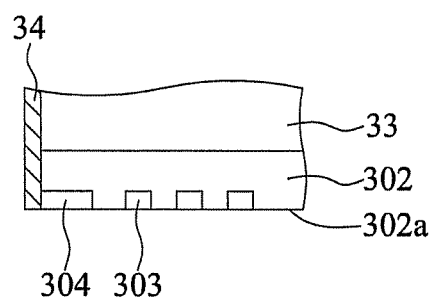

FIGS. 5A and 5B show another embodiment of the ESD protection pads 304 of the second embodiment.

Therein, at least a portion of the ESD protection pads 304 are disposed on edges of the first surface 302a of the substrate unit 302 such that after the cutting step, the portion of the ESD protection pads 304 are flush with the side surfaces of the substrate unit 302 so as to come into contact with the metal layer 34. As shown in FIG. 5A, the ESD protection pads 304 are disposed on the corners of the first surface 302a of each of the substrate units 302, and the ESD protection pads 304 of adjacent substrate units 302 are connected to each other before the cutting process of the encapsulant 33 and the package substrate 30. After the metal layer 34 is formed, the ESD protection pads 304 come into contact with the metal layer 34. Further, the ESD protection pads 304 are such as dummy pads that are electrically insulated from the ground structure of the substrate unit.

Fourth Embodiment

Figure 6A:
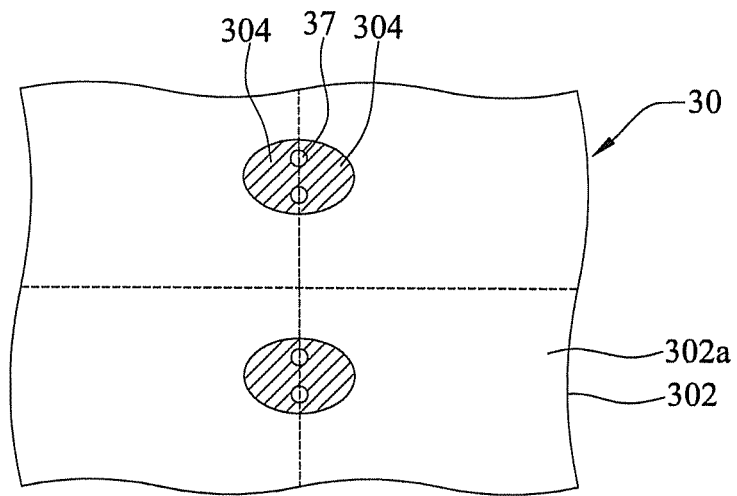
Figure 6B:
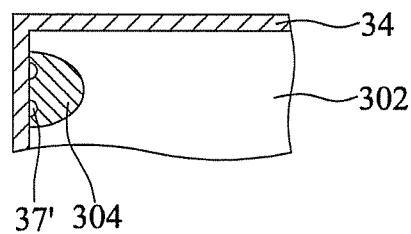

FIGS. 6A and 6B show another embodiment of the ESD protection pads 304 of the third embodiment.

FIG. 6A show ESD protection pads 304 formed on edges of the first surfaces 302a of the substrate units 302. As shown in FIG. 6A, two ESD protection pads 304 of adjacent substrate units 302 are not completely connected to each other since openings 37 are formed between the ESD protection pads 304 and exposing portions of the first surfaces 302a.

Referring to FIG. 6B, after the encapsulant 33 and the package substrate 30 are cut and the metal layer 34 is formed, the ESD protection pads 304 have indentations 37' formed at edges flush with the side surfaces of the substrate unit 302, thereby preventing burrs from forming on edges of the substrate unit 302 in the cutting process. Further, the ESD protection pads 304 disposed on the edges of the first surface 302a are electrically insulated from the ground structure. For example, the ESD protection pads 304 can be dummy pads.

Fifth Embodiment

Figure 7A:
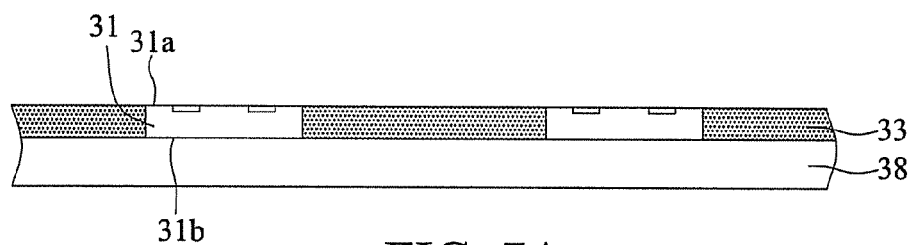
FIGS. 7A to 7C are cross-sectional views showing a package structure and a fabrication method thereof according to a fifth embodiment of the present invention.
Figure 7B:
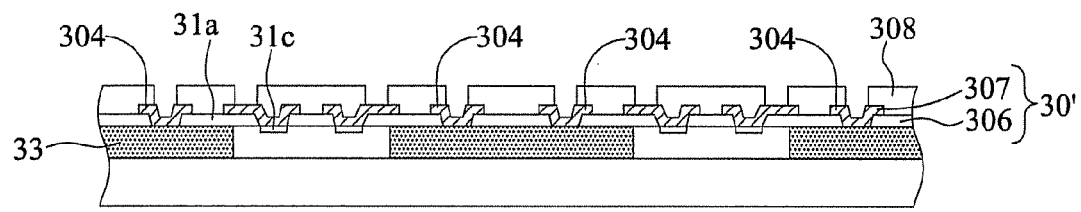
Figure 7C:
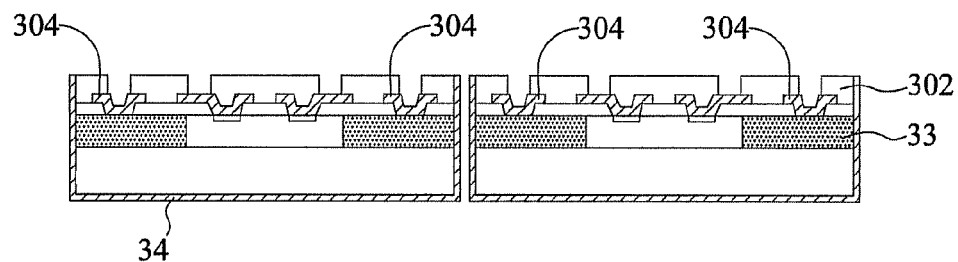

FIGS. 7A to 7C show another fabrication method of a package having ESD and EMI preventing functions. The present embodiment is similar to the first embodiment except differences in the fabrication method of the pre-formed package and the package substrate.

Referring to FIG. 7A, the fabrication method of the pre-formed package comprises the steps of: providing at least a semiconductor component 31 embedded in an encapsulant 33, wherein the semiconductor component 31 has an active surface 31a and a non-active surface 31b opposite to the active surface 31a, and the active surface 31a is exposed from the encapsulant 33. In particular, a hard board 38 is provided, which has a soft layer disposed on one surface thereof to serve as the encapuslant 33. Then, the semiconductor chip 31 is attached to the encapsulant 33 through a pick-up head and pressed in the encapsulant 33, the active surface 31a of the semiconductor component 31 being exposed from the encapsulant 33.

Referring to FIG. 7B, a build-up layer 30' is formed on the active surface 31a of the semiconductor component 31 and the encapsulant 33 so as to be used as a package substrate. In particular, the fabrication method of the build-up layer 30' comprises the steps of: disposing a dielectric layer 306 on the active surface 31a of the semiconductor component 31 and the encapsulant 33 and forming a plurality of openings in the dielectric layer 306 to expose the electrode pads 31c of the semiconductor component 31 through a photolithography process or laser process, wherein the dielectric layer 306 is a seed layer that allows a wiring layer to be attached thereto; using an RDL technique to form a first wiring layer 307 on the dielectric layer, wherein a portion of the first wiring layer 307 is electrically connected to the electrode pads 31c, and another portion of the first wiring layer 307 constitutes ESD protection pads 304 electrically insulated from the electrode pads 31c; and forming a first solder mask layer 308 on the dielectric layer 306 and the first wiring layer 307 and forming a plurality of openings in the first solder mask layer 308 to expose predetermined portions of the first wiring layer 307, the predetermined portions functioning as the above-described first conductive pads 303 and the ESD protection pads 304.

Referring to FIG. 7C, a cutting process is performed to obtain a plurality of separate package units and a metal layer 34 is formed on the exposed surfaces of the encapsulant 33 and the side surfaces of the substrate unit 302 of each of the package units. Of course, the hard board 38 can be removed first before performing the cutting process.

Therefore, the package substrate of the present invention is a carrier board with circuit. For example, the package substrate of the present embodiment is a build-up layer. But the package substrate is not limited thereto. The package substrate of the first embodiment can be a printed circuit board or a BT (Bismaleimide Triacine) substrate.

The present invention involves forming a metal layer on the exposed surfaces of the encapsulant and the side surfaces of the substrate unit of a package unit and then forming conductive elements connecting to the metal layer and the ESD protection pads. By ground connecting the metal layer through the conductive elements, the present invention can protect the semiconductor component of the package unit against EMI. In particular, before the package is disposed on a circuit substrate, if electrostatic charges present on the metal layer, they will not be conducted to the semiconductor component through the ground structure of the package, thus protecting the semiconductor component from being adversely affected by an electrostatic discharge; on the other hand, when the package is disposed on the circuit substrate, the metal layer is connected to a ground system of the circuit substrate through the conductive elements so as to provide EMI shielding form the semiconductor component and release static charges.

The above-described descriptions of the detailed embodiments are intended to illustrate the preferred implementation according to the present invention but are not intended to limit the scope of the present invention. Accordingly, all modifications and variations completed by those with ordinary skill in the art should fall within the scope of present invention defined by the appended claims.

What is claimed is:

1. A fabrication method of a package having ESD (electrostatic discharge) and EMI (electromagnetic interference) preventing functions, comprising the steps of:
  preparing a pre-formed package, the pre-formed package comprising:
    a package substrate having a plurality of substrate units each having a ground structure and an I/O structure disposed therein and a first surface and a second surface opposite to the first surface, wherein the first surface is formed with a plurality of first conductive pads and ESD protection pads, wherein the first conductive pads are electrically connected to the ground structure and the I/O structure, respectively, and comprise at least a ground pad and an I/O pad, and wherein the ground pad is free from being located between the ESD protection pads and a periphery of the substrate unit;

a plurality of semiconductor components disposed on the second surfaces of the substrate units and electrically connected to the ground structures and the I/O structures of the substrate units; and an encapsulant covering the second surfaces of the substrate units and the semiconductor components;

cutting the encapsulant and the package substrate of the pre-formed package along edges of each of the substrate units so as to obtain a plurality of separate package units;

forming a metal layer on exposed surfaces of the encapsulant and in contact with side surfaces of the substrate unit of each of the package units without contacting the ground structure, the metal layer being electrically insulated from the ground structure by the substrate unit, wherein the ESD protection pads are spaced from the metal layer or in direct contact with the metal layer; and disposing a plurality of conductive elements on the first surface of the substrate unit for electrically connecting the metal layer.

2. The method of claim 1, wherein the fabrication method of the pre-formed package comprises the steps of:

providing the package substrate having the first surface formed with a plurality of first conductive pads and ESD protection pads, wherein the first conductive pads are electrically connected to the ground structure and the I/O structure, respectively;

disposing at least a semiconductor component on the second surface of each of the substrate units and electrically connecting the semiconductor component to the ground structure and the I/O structure of the substrate unit; and covering the second surfaces of the substrate units and the semiconductor components with an encapsulant.

3. The method of claim 1, wherein the package substrate is a build-up layer, and the fabrication method of the pre-formed package comprises the steps of:

providing at least a semiconductor component embedded in an encapuslant, wherein the semiconductor component has an active surface and a non-active surface opposite to the active surface, and the active surface of the semiconductor component is exposed from the encapsulant; and forming a build-up layer on the active surface of the semiconductor component and the encapsulant so as to use the build-up layer as a package substrate.

4. The method of claim 1, wherein the ESD protection pads are disposed around the periphery of the substrate unit.

5. The method of claim 4, wherein the ESD protection pads consist of first sub-pads and second sub-pads spaced from the first sub-pads, wherein the first sub-pads are disposed on edges of the first surface of the substrate unit and flush with the side surfaces of the substrate unit.

6. The method of claim 5, wherein the second sub-pads are electrically connected to the ground structure of the substrate unit.

7. The method of claim 5, wherein the first sub-pads are electrically insulated from the ground structure of the substrate unit.

8. The method of claim 1, wherein the ESD protection pads are spaced from the metal layer, and the ESD protection pads are electrically connected to the ground structure of the substrate unit.

9. The method of claim 1, wherein the ESD protection pads are in direct contact with the metal layer, and the ESD protection pads are electrically insulated from the ground structure of the substrate unit.

10. The method of claim 1, wherein at least a portion of the ESD protection pads are disposed on edges of the first surface of the substrate unit and flush with the side surfaces of the substrate unit.

11. The method of claim 10, wherein the portion of the ESD protection pads comprise indentations disposed at edges flush with the side surfaces of the substrate unit.

12. The method of claim 10, wherein the portion of the ESD protection pads are electrically insulated from the ground structure of the substrate unit.

13. The method of claim 1, wherein side surfaces of the encapsulant are flush with the side surfaces of the substrate unit.

14. The method of claim 1, wherein the metal layer is made of one of Cu, Ni, Fe, Al and Sus (stainless steel).

* * * * *